United States Patent
Lamm et al.

(10) Patent No.: US 9,204,225 B2
(45) Date of Patent: Dec. 1, 2015

(54) TEST SYSTEM FOR EVALUATING FEEDBACK PERFORMANCE OF A LISTENING DEVICE

(75) Inventors: Jesko Lamm, Berne (CH); Thomas Trachsel, Berne (CH); Janik Buetikofer, Berne (CH); Hans-Jürg Moser, Bremgarten b. Berne (CH); Fabian Morant, Berne (CH)

(73) Assignee: BERNAFON AG, Berne (CH)

( * ) Notice: Subject to any disclaimer, the term of this patent is extended or adjusted under 35 U.S.C. 154(b) by 750 days.

(21) Appl. No.: 13/466,559

(22) Filed: May 8, 2012

(65) Prior Publication Data

US 2012/0288107 A1    Nov. 15, 2012

Related U.S. Application Data

(60) Provisional application No. 61/483,764, filed on May 9, 2011.

(30) Foreign Application Priority Data

May 9, 2011 (EP) .................................... 11165225

(51) Int. Cl.
*H04R 29/00* (2006.01)
*G10K 11/00* (2006.01)
(Continued)

(52) U.S. Cl.
CPC .............. *H04R 25/30* (2013.01); *G10K 11/004* (2013.01); *G10K 11/04* (2013.01); *H03H 9/38* (2013.01); *G10K 11/22* (2013.01); *H04R 25/453* (2013.01); *H04R 25/70* (2013.01)

(58) Field of Classification Search
CPC ...... H04R 25/30; H04R 25/453; H04R 25/70; H03H 9/38; G10K 11/004; G10K 11/02; G10K 11/025; G10K 11/04; G10K 11/22; G10K 15/00; G10K 15/08
USPC ........ 381/58–60, 318; 181/196–198, 211, 18, 181/175
See application file for complete search history.

(56) References Cited

U.S. PATENT DOCUMENTS 1,947,621 A * 2/1934 Schreiber ........................ 381/63
2,517,819 A * 8/1950 Young ............................ 333/144
(Continued)

FOREIGN PATENT DOCUMENTS

EP          1 858 003 A1    11/2007
KR     2003-0028794 A        4/2003
(Continued)

OTHER PUBLICATIONS

Blauert et al., "Acoustics for Engineers," Springer, Berlin, 2009, 2nd Ed., Section 8, pp. 104-115.
(Continued)

*Primary Examiner* — Davetta W Goins
*Assistant Examiner* — Daniel Sellers
(74) *Attorney, Agent, or Firm* — Birch, Stewart, Kolasch & Birch, LLP

(57) ABSTRACT

A test system for evaluates acoustic feedback characteristics of a listening device by changing the transfer function of the signal path from an acoustic output to an acoustic input of the listening device. A variable filter comprises an acoustic input, an acoustic output, and a control unit for changing a transfer function of the filter. First and/or second acoustic propagation elements propagate acoustic sound, the first acoustic propagation element acoustically connecting the acoustic output of the listening device with the acoustic input of the variable filter, the second acoustic propagation element acoustically connecting the acoustic output of the variable filter with the acoustic input of the listening device; wherein the system is configured to allow a determination of acoustic feedback or a level of acoustic feedback of the listening device at different frequencies.

20 Claims, 9 Drawing Sheets

(51) Int. Cl.
*H04R 25/00* (2006.01)
*H03H 9/38* (2006.01)
*G10K 11/04* (2006.01)
*G10K 11/22* (2006.01)

(56) References Cited

U.S. PATENT DOCUMENTS

| | | |
|---|---|---|
| 5,144,675 A | 9/1992 | Killion et al. |
| 6,665,410 B1 | 12/2003 | Parkins |
| 2002/0082794 A1 | 6/2002 | Kachler et al. |
| 2002/0176584 A1* | 11/2002 | Kates ............................. 381/60 |
| 2006/0285709 A1 | 12/2006 | Barthel |
| 2007/0269051 A1 | 11/2007 | Weidner |
| 2008/0095389 A1 | 4/2008 | Theverapperuma |
| 2008/0292122 A1 | 11/2008 | Nordahn et al. |
| 2009/0067654 A1 | 3/2009 | Klinkby et al. |
| 2010/0232634 A1 | 9/2010 | Boldt |
| 2011/0103613 A1* | 5/2011 | Van Der Werf et al. ........ 381/93 |

FOREIGN PATENT DOCUMENTS

| | | |
|---|---|---|
| WO | WO 94/09604 A1 | 4/1994 |
| WO | WO 03/081947 A1 | 10/2003 |
| WO | WO 2005/096670 A1 | 10/2005 |

OTHER PUBLICATIONS

Bustamante et al., "Measurement and Adaptive Suppression of Acoustic Feedback in Hearing Aids," IEEE, May 23, 1989, pp. 2017-2020, XP010082692.

* cited by examiner

TEST SYSTEM FOR EVALUATING FEEDBACK PERFORMANCE OF A LISTENING DEVICE

This nonprovisional application claims the benefit of U.S. Provisional Application No. 61/483,764 filed on May 9, 2011 and to patent application Ser. No. 11/165,225.1 filed in Europe on May 9, 2011. The entire contents of all of the above applications is hereby incorporated by reference.

TECHNICAL FIELD

The present application relates to acoustic feedback, in particular to the verification of acoustic feedback in listening devices, e.g. hearing aids. The disclosure relates specifically to a test system for evaluating acoustic feedback characteristics of a listening device by systematically changing the transfer function of the signal path from an acoustic output to an acoustic input of the listening device. The disclosure also relates to use of the test system. The disclosure further relates to a combination of a test system and a listening device.

The application furthermore relates to a method of characterizing acoustic feedback at different frequencies from an acoustic output to an acoustic input of a listening device.

The disclosure may e.g. be useful in applications wherein acoustic feedback may occur and needs to be evaluated, such as in hearing aids, headsets, telephone sets, etc.

BACKGROUND ART

The following account of the prior art relates to one of the areas of application of the present application, hearing aids. A hearing aid comprises an input transducer (microphone) and an output transducer (speaker) and a forward path there between providing a frequency dependent gain of a signal originating from the input transducer and presenting such resulting signal to the output transducer.

Frequency dependent acoustic, electrical and mechanical feedback identification and compensation methods are commonly used in listening devices, in particular hearing instruments (HI), to ensure their stability. Unstable systems due to acoustic feedback tend to significantly contaminate the desired audio input signal with narrow-band frequency components, which are often perceived by a user as howl or whistle. Acoustic feedback occurs because the output loudspeaker signal from an audio system providing amplification of a signal picked up by a microphone is partly returned to the microphone via an acoustic coupling through the air or other media. The part of the loudspeaker signal returned to the microphone is then re-amplified by the system before it is re-presented at the loudspeaker, and again returned to the microphone. As this cycle continues, the effect of acoustic feedback becomes audible as artifacts or even worse, howling, when the system becomes unstable. The problem appears typically when the microphone and the loudspeaker are placed closely together, as e.g. in hearing aids. Some other classic situations with feedback problem are telephony, public address systems, headsets, audio conference systems, etc.

Feedback performance of hearing instruments becomes more and more important, since fittings get more and more open in that an ear canal part of the instrument does not fully close the ear canal so that sound intended for the ear drum more easily escapes, resulting in higher feedback likelihood. This is why hearing instrument manufacturers have been developing technology to fight feedback, e.g. mechanical designs with optimized vibration performance, but also electronic systems that can actively fight feedback—so called "Feedback Cancellers".

The verification of feedback performance for a given hearing instrument system is difficult, because realistic feedback only occurs if the system is integrated as a whole and used in realistic wearing conditions. Especially, the so-called (acoustic) feedback path (the acoustic path from the hearing instrument's sound outlet to its microphone inlet) has to be estimated with realistic parameters:

The throughput delay of the path has to be in a realistic parameter range, because usually Feedback Cancellers in hearing aids are based on certain assumptions on this parameter range that should preferably not be violated during the majority of test cases. Thus the test system preferably comprises an appropriate variable delay unit.

Ideally, the test system is adapted to be able to vary the transfer function of the feedback path within parameter ranges given by the realistic use of the hearing instrument when being worn at the ear of a user. To cover enough realistic situations with the test, means to enforce a set of different transfer functions of the feedback path should preferably be included in the test system. To cover all elements of this set, feedback-related testing requires means (e.g. appropriate filter elements) of enforcing a desired transfer function within a certain tolerance range.

A realistic condition could be emulated by putting the HI on an artificial ear at an artificial head; however, the systematic variation of the feedback path cannot be achieved in this setup with prior art components.

DISCLOSURE OF INVENTION

The present disclosure attempts to provide a solution to the problem of systematically varying the feedback path in order to test the reaction of a listening device to steady-state conditions of the feedback path.

In an aspect of the invention an acoustic emulator of the feedback path is provided. The acoustic emulator allows systematic modification of the transfer function between the sound outlet of a hearing instrument under test and its microphone inlet.

Theoretically, one could think of simulators or electronic emulators for achieving the same functionality. However, since throughput delay plays an important role in feedback cancellation, such systems are often not satisfactory, because they have a higher-than-realistic throughput delay.

In an embodiment, the emulated feedback path is established by acoustic means and thus is comparable to realistic feedback paths based on acoustic wave propagation.

An object of the present application is to provide a tool for verifying acoustic feedback in a listening device at different frequencies.

Objects of the application are achieved by the invention described in the accompanying claims and as described in the following.

A Test System:

An object of the application is achieved by a test system for evaluating acoustic feedback characteristics of a listening device by changing the transfer function of the signal path from an acoustic output to an acoustic input of the listening device. The test system comprises, a) a variable filter comprising an acoustic input and an acoustic output, the variable filter comprising a control unit for changing a transfer function of the filter;

b) first and/or second acoustic propagation elements for propagating acoustic sound, the first acoustic propagation element acoustically connecting the acoustic output of the listening device with the acoustic input of the variable filter, the second acoustic propagation element acoustically connecting the acoustic output of the variable filter with the acoustic input of the listening device;

wherein the system is configured to allow a determination of acoustic feedback or a level of acoustic feedback of the listening device at different frequencies.

This has the advantage of allowing a determination of frequencies where a particular listening device is prone to acoustic feedback.

In the present context acoustic feedback is taken to refer to narrow-band frequency components that are distinct in the wide band acoustic signal. In an embodiment, acoustic feedback is assumed, when a peak is detected in the input signal picked up by the microphone of the listening device and where the peek is NOT assumed to form part of the target input signal. In an embodiment, a feedback component is assumed to comprise a signal component above a predefined minimum level, e.g. 30 dB SPL. In an embodiment, a feedback component is assumed to comprise a signal component in a relatively narrow frequency range, e.g. less than 40 Hz.

The test system comprises at least one acoustic propagation element (at least comprising one of the first or the second acoustic propagation elements). In an embodiment, test system comprises the first acoustic propagation element. In an embodiment, the test system comprises the first and the second acoustic propagation elements. In an embodiment, the first and/or second acoustic propagation elements) comprise(s) a tube, at least over a part of its longitudinal extension. Preferably, the system is adapted to provide that the propagation elements are coupled as tightly as possible (i.e. acoustically sealed) to input and/or output transducers of the listening device. This provides maximum control over the feedback path in the filter. Even the "best" coupling will be non-ideal in the sense that it adds some "filtering" to the propagation path, though. To have a very precise shaping of the feedback path, the variable filter is in a preferred embodiment designed to compensate for such effects. In an embodiment, the physical length of a propagation element is optimized, e.g. minimized. In an embodiment, the first acoustic propagation element comprises a tube acoustically connecting the acoustic output of the listening device with the acoustic input of the variable filter. In an embodiment, the second acoustic propagation element comprises a tube acoustically connecting the acoustic output of the variable filter with the acoustic input of the listening device.

In an embodiment, the variable filter is a variable acoustic filter. In an embodiment, the variable filter comprises an enclosure comprising a cavity with a variable volume allowing an acoustic resonance frequency of the system to be varied. In an embodiment, the enclosure comprising a cavity with a variable volume comprises a body comprising cylindrical or prismatic inner walls and two transversal walls. In an embodiment, the transversal walls comprise a bottom wall and a piston being adapted for sliding along the cylindrical or prismatic inner walls, whereby the volume of the cavity between the piston and the bottom wall can be varied. In an embodiment, both transversal walls of the cavity are movable. In an embodiment, the control unit for changing a transfer function of the filter is adapted for controlling the volume of the cavity. In an embodiment, the control unit for changing a transfer function of the filter comprises a piston (and possibly an element for controlling its movement). In an embodiment, the enclosure comprises a flexible material allowing its volume to be modified (over an appropriate range, e.g. adapted to the application in question). The use of a variable (all) acoustic filter has the advantage of minimizing delay in the feedback path of the test system.

In an embodiment, the variable filter comprises
  an acoustic input transducer for converting an input sound to an electric input signal;
  a variable electric filter for filtering the electric input signal and providing a filtered output signal;
  an acoustic output transducer for converting the filtered output signal to a filtered output sound.

This has the advantage that the variable filter can be controlled by electric means. In an embodiment, the variable filter comprises a (electric) control unit for controlling the filtering properties of the variable electric filter. In an embodiment, the variable electric filter is adapted to compensate for unintended filtering introduced by other parts of the test system, e.g. the propagation elements and/or a possible chamber enclosing the listening device. In an embodiment, the variable electric filter is a programmable filter bank. In an embodiment, the variable electric filter comprises a band-pass filter whose centre frequency (and possibly band width) is selectable (and/or variable). In an embodiment, the variable electric filter comprises a FIR filter or an IIR filter. In an embodiment, the control unit for changing a transfer function of the variable filter is adapted to control filter coefficients of the variable electric filter. In an embodiment, the control unit is adapted to introduce a delay in the signal path of the variable filter.

In an embodiment, the test system comprises a memory for storing estimates (e.g. measured values or estimates) of current feedback values (e.g. at different frequencies and points in time).

In an embodiment, the test system for acoustic feedback verification comprises an analyzing unit for accessing and analyzing feedback data collected by the test system and stored in the memory. In an embodiment, the memory or a part thereof is located in the analysing unit. In an embodiment, the test system, e.g. the analysing unit, comprises a feedback estimation unit for estimating current feedback in the listening device (preferably at a number of frequencies).

In an embodiment, the variable filter comprises a communication interface (wired or wireless), e.g. to the analysing unit and/or to the listening device. In an embodiment, the analysing unit is adapted to control the transfer function of the variable filter via the communication interface (and the control unit of the variable filter).

In an embodiment, the analysing unit comprises a communication interface to the listening device allowing exchange of data and commands. The listening device may comprise a feedback estimation unit for estimating current feedback in the listening device (preferably at a number of frequencies), such current feedback values being made available to the test system via said communication interface. The listening device preferably comprises a memory for storing estimated feedback values (e.g. at different points in time). In an embodiment, the memory form part of a data logger for logging various operational parameters, e.g. including the occurrence of acoustic feedback, of the listening device, over time. In an embodiment, the occurrence of acoustic feedback as detected by the listening device is logged over time and frequency. The detected feedback values in the listening device can be transferred to the analysing unit via the communication interface for further processing and analysis. Alternatively or additionally, the analysing unit may be adapted to estimate feedback in the listening device, while connected to the listening device via the communication interface. Thereby the analysing unit is able to change the transfer function of the variable filter in harmony with the detection of feedback in the listening device. Further, it allows a procedure where the variation of the transfer function of the variable filter and the corresponding feedback measurement are performed (e.g. automatically performed) according to a predefined scheme. In an embodiment, the analysing unit is adapted to run a fitting software for controlling data and processing parameters of the listening device and for reading data (e.g. stored feedback values) from the listening device. This has the advantage that the listening device and the test measurement can be controlled from the (same) analysing unit, whereby parameters (e.g. a gain, e.g. a gain in a particular frequency band) of the listening device can be easily changed prior to initiation of a feedback measurement, possibly in an automated procedure.

In an embodiment, the test system for acoustic feedback verification is adapted to verify (e.g. check the accuracy of) acoustic feedback data stored in a data logger of the listening device during a time period of operation.

In an embodiment, the test system comprises a structural element for emulating an operational condition of the listening device, when the listening device is mounted in the test system at or on the structural element. In an embodiment, the structural element comprises a reflecting surface. In an embodiment, the structural element comprises an artificial ear. In an embodiment, the structural element comprises an artificial head. In an embodiment, the artificial ear is located at the artificial head. In an embodiment, the test system is adapted to provide that the listening device can be mounted relative to the structural element to emulate an operating condition of the listening device.

In an embodiment, the test system comprises a variable delay unit, allowing a time delay of the acoustic feedback path to be varied. Thereby delays corresponding to (different) realistic feedback paths can be emulated.

In an embodiment, the test system comprises a chamber for enclosing parts of or the whole of one or more of the listening device, the variable filter and the propagation elements. This has the advantage that important parts of the test system can be acoustically isolated from acoustic signals from the environment.

In an embodiment, the test system comprises a chamber for enclosing the listening device, the chamber comprising an acoustic input and an acoustic output acoustically connected to the first and/or second acoustic propagation elements to allow the acoustic input and output of the listening device to be acoustically connected to the variable filter while being located in the chamber. In an embodiment, the chamber for enclosing the listening device is acoustically insulated. In an embodiment, the interface between the acoustic propagation elements and the acoustic input and/or output, respectively, of the chamber comprises a sealing element. In an embodiment, the second acoustic propagation element comprises a tube acoustically connecting the acoustic output of the variable filter with the acoustic input of the chamber (but not necessarily extending to the the acoustic input (microphone input) of the listening device).

In an embodiment, the chamber for enclosing the listening device during test forms part of a cavity of the variable filter. In such embodiment, either the first or second acoustic propagation elements may be dispensed with (cf. e.g. the embodiment of FIG. 6). Preferably, the system comprises the first propagation element.

Preferably the acoustic propagation elements are acoustically sealed against sounds from the environment. Preferably, the chamber for enclosing the listening device is sealed against sounds from the environment. Sealing can be important for both tubes and chamber. Sealing does not avoid reflections, it even contributes to them. While reflection is desired in tubes in order to contribute to the propagation of sound, it is undesirable in the acoustic chamber as soon as its size is comparable to wavelengths of sound, because reflection at walls in a distance comparable to this wavelength would create additional modes of oscillation that make it more difficult to keep the acoustic transfer function of the whole system under control.

In an embodiment, the chamber is adapted to minimize reflections from its inner walls.

Acoustic sealing is important to avoid multi-path propagation of sound, which would be very difficult to keep under control. The sealed tubes (and if present, the chamber) ideally provides one propagation path. Preferably, sealing is achieved by making the elements to seal and their connections air-tight and by choosing materials with a low tendency to vibration. The propagation elements should preferably have the following properties in order to conduct sound well:

much higher density than air at room temperature
smooth surface
high stiffness.

However, it may be desirable in certain cases to explicitly violate one or more of the stated criteria in order to design the acoustic properties of the propagation elements (e.g. to add attenuation). Acoustic insulation can e.g. be provided by constructing tubes from stiff materials like metal or stiff polymers. In an embodiment, the acoustic properties of the test system (e.g. the variable filter, the propagation elements, the chamber (if present), etc.) are adapted to the intended operational use of the listening device. In an embodiment, the interface(s) between the acoustic propagation elements and the acoustic input and/or output, respectively, of the listening device comprise(s) a sealing element.

In an embodiment, the variable filter is adapted for selecting a predefined part of a frequency range of operation, e.g. a particular frequency band FR. In an embodiment, the variable filter is adapted for propagating input signal components in a predefined frequency range (e.g. a particular frequency band FR) and attenuating input signal components outside the predefined frequency range. Thereby the acoustic output of the variable filter comprises mainly signal components of the predefined part of a frequency range, e.g. a particular frequency band FR. In an embodiment, the variable filter is a band-pass filter adapted for allowing signal components at frequencies within a predefined frequency band FR to pass, whereas signal components at other frequencies are attenuated. In an embodiment, the variable filter is adapted to allow the predefined frequency band FR to be changed to provide band-pass filtering in different frequency bands, i=1, 2, . . . , N. In an embodiment, the variable filter is adapted to allow the predefined frequency band $FB_i$ to be changed to provide band-pass filtering in different frequency bands of a predefined frequency range $[f_{min}; f_{max}]$ from a minimum frequency $f_{min}$ to a maximum frequency $f_{max}$. In an embodiment, the frequency bands $FB_i$, i=1, 2, . . . , N span the predefined frequency range $[f_{min}; f_{max}]$. In a particular embodiment, the frequency range of operation that is selectable by the variable filter comprises the frequency range of operation of the listening device to be tested or at least a part thereof. In an embodiment, the variable filter is adapted to be controllable to select frequency ranges that comply with or correspond to frequency ranges of the listening device to be tested (e.g. so that the variable filter can select out at least some of the frequency ranges wherein the listening device individually processes the audio signal). In an embodiment, the bandwidth of a band-pass filter is defined by its upper and lower 3 dB cutoff frequencies.

In an embodiment, the system is adapted to conduct measurements of feedback in a predefined part of the normal frequency of operation of the listening device, e.g. where feedback is expected to occur. In an embodiment, measurements of feedback are conducted only in a predefined frequency range $[f_{min,fb}; f_{max,fb}]$, where feedback is expected to occur. In an embodiment, $f_{min,fb}$ is in the range from 1.5 kHz to 2.5 kHz. In an embodiment, $f_{max,fb}$ is in the range from 4 kHz to 6 kHz.

In an embodiment, the listening device and/or the test system comprises a feedback estimation unit adapted for determining feedback at a particular frequency or in a particular frequency range, e.g. corresponding to the frequency range selected by the variable filter. In an embodiment, the feedback estimation unit comprises a level detector (LD) for determining (or estimating) an input level of a signal introduced into the chamber via its acoustic input. In an embodiment, the feedback signal to the listening device (e.g. introduced in a chamber enclosing the listening device) is picked up by a microphone of the listening device. Alternatively or additionally, the signal may be picked up by a microphone of the test system, e.g. located in the vicinity of the listening device (e.g. in or in connection with a chamber).

In an embodiment, the test system (e.g. an analyzing unit) is adapted to provide that the frequency content of the signal from a measurement microphone of the test system (e.g. located in a chamber) is determined in order to monitor the test and/or to adjust the variable filter to produce the intended feedback situation.

In an embodiment, feedback at a particular frequency $f_i$ or in a particular frequency range $FB_i$ is determined in the feedback estimation unit by determining a level (e.g. by a level detector) or an average level or a power spectral density (e.g. by a frequency analyzing unit) of the signal picked up by an acoustic input transducer of the listening device when mounted in or connected to the test system (e.g. in a chamber), when the variable filter is set to select or propagate said frequency $f_i$ or said frequency range FR. Feedback estimators (feedback estimation units) are e.g. implemented by adaptive filters that model the external feedback path and that are matched to it by means of an adaptive algorithm, e.g. an LMS algorithm. Frequency estimation can also be done using auto-regressive estimators. Level estimation is implicit in both approaches.

Use of the System:

Use of a test system as described above, in the detailed description of 'mode(s) for carrying out the invention' and in the claims, is moreover provided by the present application. In an embodiment, use is provided wherein the listening device is a hearing instrument or a headset.

A Test System and a Listening Device:

In an aspect, a combination of a test system for characterizing acoustic feedback from an acoustic output to an acoustic input of a listening device at different frequencies AND the listening device is provided.

Preferably, the test system is a test system (for evaluating acoustic feedback characteristics of a listening device) as described above, in the detailed description of 'mode(s) for carrying out the invention' and in the claims.

In an embodiment, the listening device comprises a feedback estimation unit for estimating an acoustic feedback path. In an embodiment, the listening device comprises a feedback cancellation system for adaptively cancelling or minimizing acoustic feedback. In an embodiment, the feedback cancellation system is inactive during use of the test system. In another embodiment, the feedback cancellation system is active during use of the test system.

In an embodiment, the listening device comprises an output transducer for converting an electric output signal to a stimulus perceived by the user as an acoustic signal (the acoustic output of the listening device). In an embodiment, the output transducer comprises a receiver (=speaker) for providing the stimulus as an acoustic signal to a user.

In an embodiment, the listening device comprises an input transducer for converting an input sound (the acoustic input to the listening device) to an electric input signal. In an embodiment, the input transducer comprises a microphone.

The listening device preferably comprises a memory for storing measured values of feedback at different frequencies or frequency ranges (cf. block MEM in FIG. 1).

In an embodiment, the memory of the listening device form part of a data logger for logging various operational parameters, e.g. including the occurrence of acoustic feedback, of the listening device, over time. In an embodiment, the occurrence of acoustic feedback as detected by the listening device is logged over time and frequency.

In an embodiment, the test system and listening device are adapted to verify (e.g. check the accuracy of) acoustic feedback data stored in a data logger of the listening device during a time period of operation of the listening device (typically prior to mounting of the listening device in the test system).

In an embodiment, the listening device comprises a level detector (LD) for determining (or estimating) an input level of a signal picked up by (or originating from) an input transducer of the listening device (e.g. providing levels of different frequency band signals and/or of the full (wide band) signal).

In an embodiment, the listening device is adapted to provide a frequency dependent gain to compensate for a hearing loss of a user. In an embodiment, the listening device comprises a signal processing unit for enhancing an input signal (originating from the electric input signal provided by the input transducer) and providing a processed output signal (whereon the electric output signal for being presented to a user as an acoustic signal is based). In an embodiment, the listening device comprises a portable device comprising a microphone and a loudspeaker, e.g. a hearing instrument, a headset, a telephone (e.g. a telephone) or a combination thereof.

In an embodiment, the listening device comprises a frequency analyzing unit for—at a given time—characterizing a signal (e.g. a signal picked up by a microphone of the listening device) at different frequencies, e.g. determining a power spectral density in different frequency ranges. Alternatively, such functionality may form part of an external analyzing unit or of the test system.

In an embodiment, the listening device comprises an interface to an analyzing unit and (optionally) to a programming unit (cf. block IF in FIG. 1), e.g. to a device capable of running programming or fitting software for the listening device, and from which data collected by the listening device can be analyzed and (optionally) from which data or program parameters can be uploaded to and/or controlled in the listening device. In an embodiment, the listening device comprises an interface to the variable filter to allow a coordinated setting of the variable filter properties and controlling the corresponding measurement of acoustic feedback in the listening device. In an embodiment, the listening device comprises a (possibly standardized) electric interface (e.g. in the form of a connector) for establishing a wired or wireless connection to the analyzing unit (and optionally to a programming unit). In case of a wireless interface, the listening device comprises antenna and transceiver circuitry for wirelessly exchanging signals with the analyzing/programming unit.

In an embodiment, the test system (e.g. the analyzing unit or the listening device) comprises a frequency analyzer for measuring and analyzing a microphone signal (e.g. its power density spectrum) picked up either by a microphone of the test system or by a microphone of the listening device. In an embodiment, the test system is adapted for use as a tool to the development of a feedback estimation algorithm. In an embodiment, the analyzing unit is adapted to modify parameters of a feedback algorithm AND to measure the impact on detected feedback, while the feedback estimation algorithm is either actively used in the feedback cancellation system of the listening device or—alternatively—toggled between an on and off state, if the difference between the on and off state of the feedback cancellation system (i.e. the effect of using the feedback cancellation system with the modified parameters) should also be evaluated with the test system.

A Method:

A method of characterizing acoustic feedback at different frequencies from an acoustic output to an acoustic input of a listening device is furthermore provided by the present application. The method comprises a) providing a variable filter for selecting a part of a frequency range of operation of the listening device;

b) acoustically connecting an acoustic output of the listening device to an acoustic input of the variable filter and acoustically connecting an output of the variable filter to an acoustic input of the listening device;

c) determining acoustic feedback or a level of acoustic feedback of the listening device in different parts of the frequency range.

It is intended that the structural features of the test system described above, in the detailed description of 'mode(s) for carrying out the invention' and in the claims can be combined with the method, when appropriately substituted by a corresponding process. Embodiments of the method have the same advantages as the corresponding systems.

In an embodiment, the method comprises enclosing one or more of the listening device, the variable filter, and an element for acoustic connection of the variable filter and the listening device in a chamber. In an embodiment, the chamber comprises an acoustic input and an acoustic output. In an embodiment, the method comprises acoustically connecting the acoustic output of the listening device to the acoustic output of the chamber to provide that output sound from the listening device is directly fed to the input of the variable filter.

In an embodiment, the method comprises analyzing a microphone signal (e.g. its power density spectrum) picked up either by a microphone of the test system or by a microphone of the listening device. In an embodiment, the method is adapted for use in the development of a feedback estimation algorithm. In an embodiment, the method comprises modifying a parameter of a feedback algorithm AND measuring the impact on detected feedback.

Further objects of the application are achieved by the embodiments defined in the dependent claims and in the detailed description of the invention.

As used herein, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/ or groups thereof. It will also be understood that when an element is referred to as being "connected" or "coupled" to another element, it can be directly connected or coupled to the other element or intervening elements may be present, unless expressly stated otherwise. Furthermore, "connected" or "coupled" as used herein may include wirelessly connected or coupled. As used herein, the term "and/or" includes any and all combinations of one or more of the associated listed items. The steps of any method disclosed herein do not have to be performed in the exact order disclosed, unless expressly stated otherwise.

BRIEF DESCRIPTION OF DRAWINGS

The disclosure will be explained more fully below in connection with a preferred embodiment and with reference to the drawings in which.

The figures are schematic and simplified for clarity, and they just show details which are essential to the understanding of the disclosure, while other details are left out. Throughout, the same reference signs are used for identical or corresponding parts.

Further scope of applicability of the present disclosure will become apparent from the detailed description given hereinafter. However, it should be understood that the detailed description and specific examples, while indicating preferred embodiments of the disclosure, are given by way of illustration only. Other embodiments may become apparent to those skilled in the art from the following detailed description.

MODE(S) FOR CARRYING OUT THE INVENTION

FIG. 1 shows block diagrams of a listening device in various embodiments, which can each be used with a test system as described in the present disclosure. FIGS. 1a to 1d illustrates 4 different embodiments of a listening device (e.g. a hearing instrument or a headset or the like) each comprising 1) a forward path, from an input transducer (MIC) to an output transducer (SPK), for processing an input signal from the input transducer to an output signal to the output transducer and 2) an analysis path for analysing the signal received from the input transducer (possibly in comparison with the output signal forwarded to the output transducer) and thereby detecting frequency dependent acoustic feedback. In the embodiments of FIGS. 1a and 1b the forward path and analysis path (or at least the elements shown) are both assumed to work fully in the time domain. In the embodiment of FIG. 1c the components of the forward path are assumed to process signals in the time domain, whereas the components of the analysis path (or at least the elements shown) are assumed to process the signals in the (time-) frequency domain. In the embodiment of FIG. 1d, the forward path and the analysis path (or at least the elements shown) are both assumed to work fully in the (time-) frequency domain.

Figure 1A:
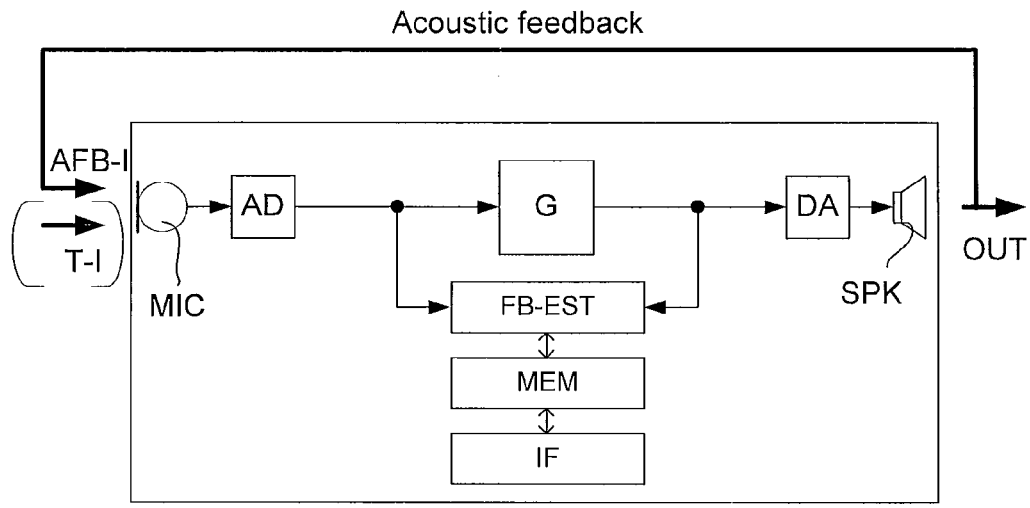
FIG. 1 shows block diagrams of a listening device in various embodiments, which can each be used with a test system as described in the present disclosure.

All four embodiments comprise the elements of the embodiment shown in FIG. 1a, which is described in the following.

The forward path between the input transducer (MIC, e.g. a microphone system, e.g. a directional microphone system, e.g. comprising a multitude of microphones) and the output transducer (SPK, e.g. a speaker) comprises a signal processing unit (G, providing at least a part of its functionality in the forward path). In an embodiment, the signal processing unit is adapted to provide a frequency dependent gain according to a user's particular needs or to otherwise process an input signal and provide a processed output signal (e.g. by providing noise reduction and/or compression). It is assumed that the signal processing of the listening device is mainly performed in the digital domain. Hence, the embodiments shown comprise relevant analogue to digital (AD) and digital to analogue (DA) converters, where appropriate, here shown connected to, respectively, the input and output transducers.

An acoustic feedback path from the output transducer SPK (providing acoustic output signal OUT) to the input transducer MIC is shown by the bold arrow designated Acoustic feedback. The acoustic input to the input transducer (MIC) of the listening device thus normally comprise a target signal input part (T-I) (which is intended to be enhanced) and an (unintended) acoustic feedback input part (AFB-I) (which is intended to be cancelled). In the present application, however, where focus is on measuring acoustic feedback, the target signal input (T-I) is assumed to be minimal (and preferably nil) during feedback measurements and is ignored (as indicated in FIG. 1a-1d by the parenthesis around the 'T-I'.

The listening device comprises a memory (MEM) for storing measured values of feedback at different frequencies or frequency ranges (e.g. as estimated at different points in time).

The listening device further comprises a feedback estimation unit FB-EST operationally connected to the input transducer (MIC) and to the output transducer (SPK). The feedback estimation unit FB-EST is configured to detect acoustic feedback (and preferably estimate the amount of acoustic feedback at a given point in time). This can e.g. be implemented by detecting tonal components in the input signal or by detecting high gain in the estimated loop gain of the feedback path (and preferably counting the number of occurrences of such detections within a given observation period). Tonal components can e.g. be detected by using the earlier-mentioned auto-regressive estimator, e.g. a second order auto-regressive (AR) estimator. In the case of a second-order AR estimator, the criterion 'presence of a tonal component' can be obtained by defining that a tonal component is recognized whenever a pole of the underlying AR process is within a certain small distance from the unit circle in the z-plane (example for such distance limit: 0.1). The estimated loop gain can e.g. be obtained by computing the frequency response of the earlier-mentioned adaptive filter that is used in the HI to model its feedback path in combination with the earlier-mentioned LMS algorithm. The feedback estimation unit FB-EST is adapted to store results in the memory MEM, e.g. according to a predefined scheme. By varying the transfer function of the variable filter of the test system (cf. e.g. FIG. 2, 3), e.g. according to a predefined scheme, corresponding values of the detection of feedback or not (and/or the amount of feedback detected) and the frequency ranges defined by the various transfer functions of the variable filter applied during the measurement of feedback, can be stored in the memory, as these different filter transfer functions are successively applied.

Figure 4:
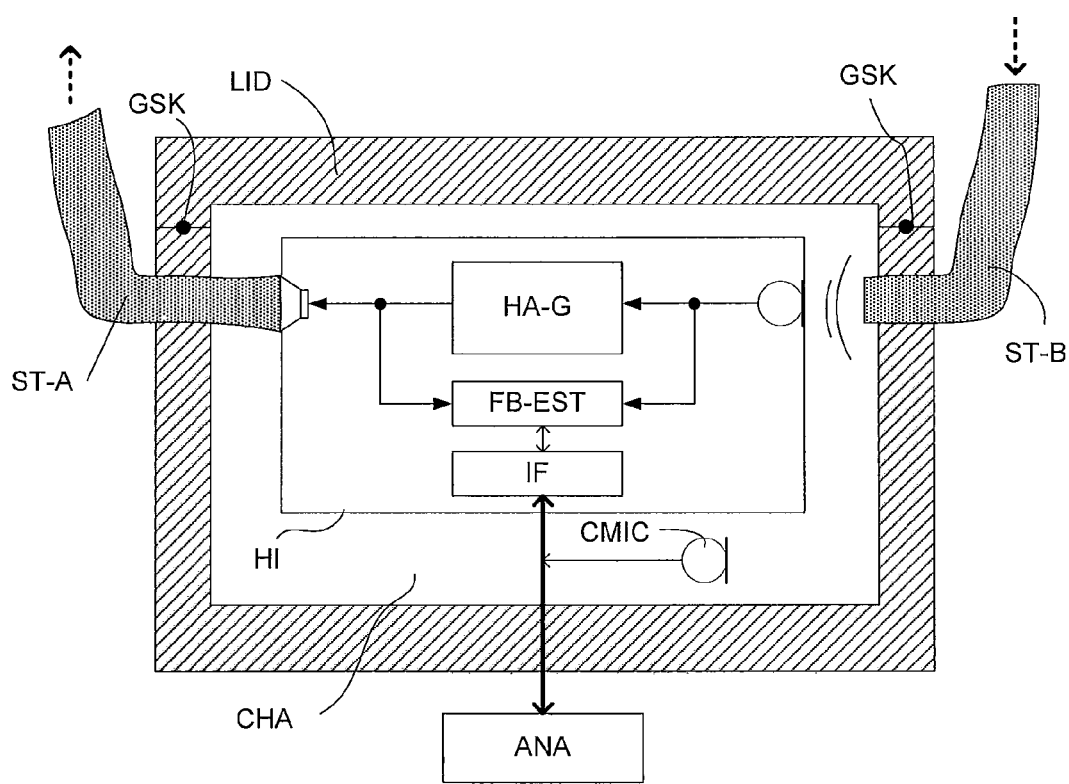
FIG. 4 shows a part of a third embodiment of a test system according to the present disclosure, wherein the chamber comprises a microphone and wherein an analysing unit is connected to the listening device.
Figure 5:
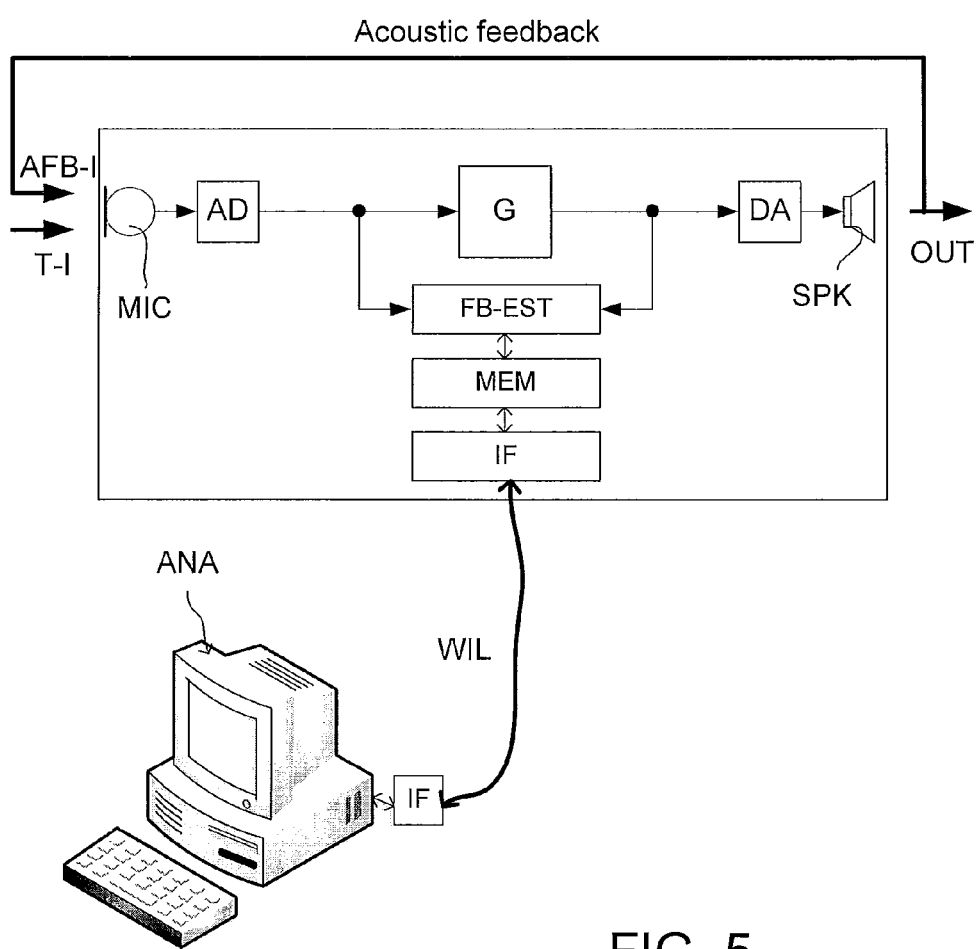
FIG. 5 shows a part of a fourth embodiment of a test system according to the present disclosure comprising an analysing unit connected to the listening device being tested.
Figure 6A:
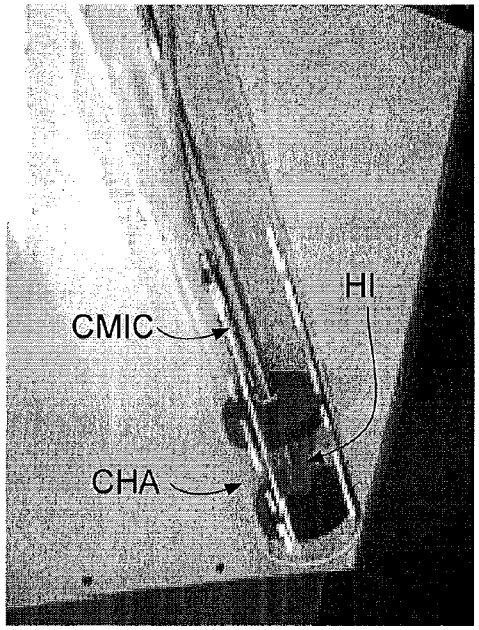
FIG. 6 shows an example of a variable acoustic filter.
Figure 6B:
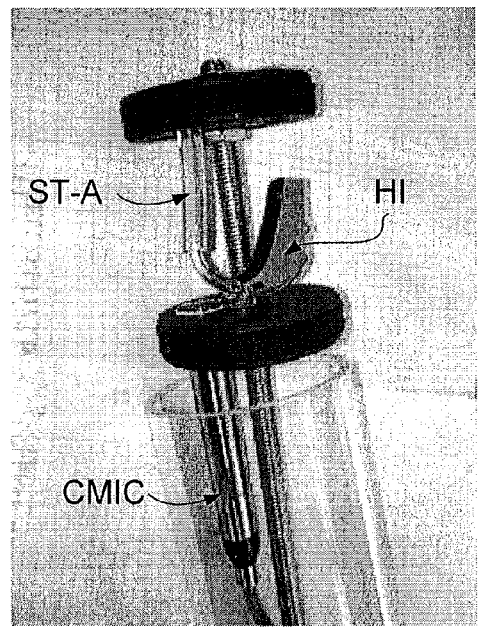
Figure 6C:
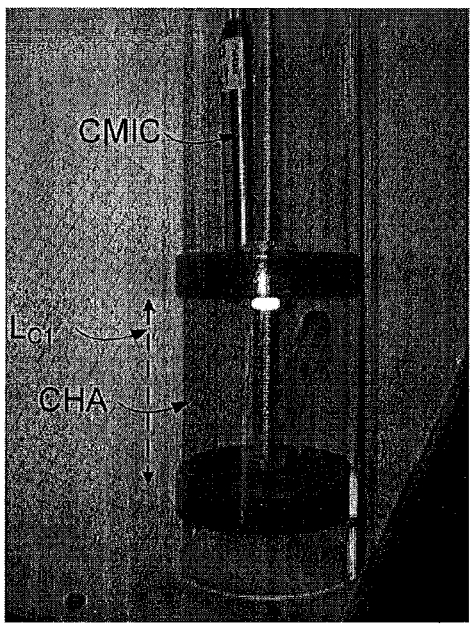
Figure 6D:
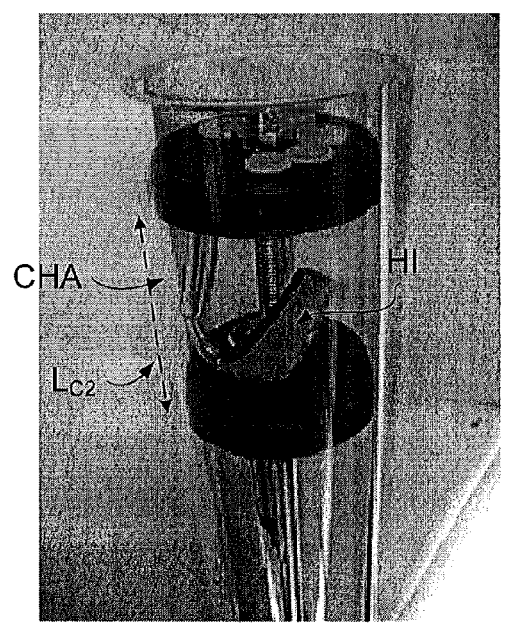

The listening device comprises an interface IF for establishing a communication link to an analyzing device (e.g. a device also running software for customizing features of the listening device, so-called fitting software) of the test system (cf. e.g. FIG. 4, 5). In an embodiment, the listening device comprises an antenna and transceiver circuitry for establishing a wireless connection to the analyzing device (and possibly to the variable filter and/or to peripheral units). In an embodiment, the listening device comprises a (possibly standardized) electric interface (e.g. in the form of a connector) for establishing a wired connection to the analyzing device (and possibly to the variable filter and/or to peripheral units). Using the interface IF, data stored in the memory MEM of the listening device are accessible to the analyzing device (cf. e.g. ANA in FIG. 4 or 5) for further evaluation.

Figure 1B:
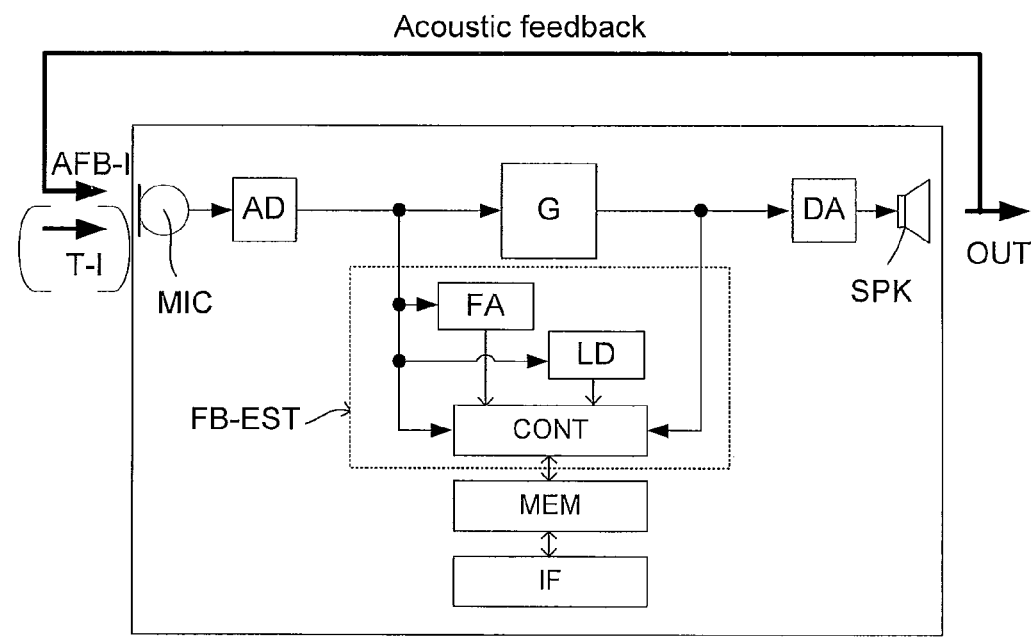
Figure 1C:
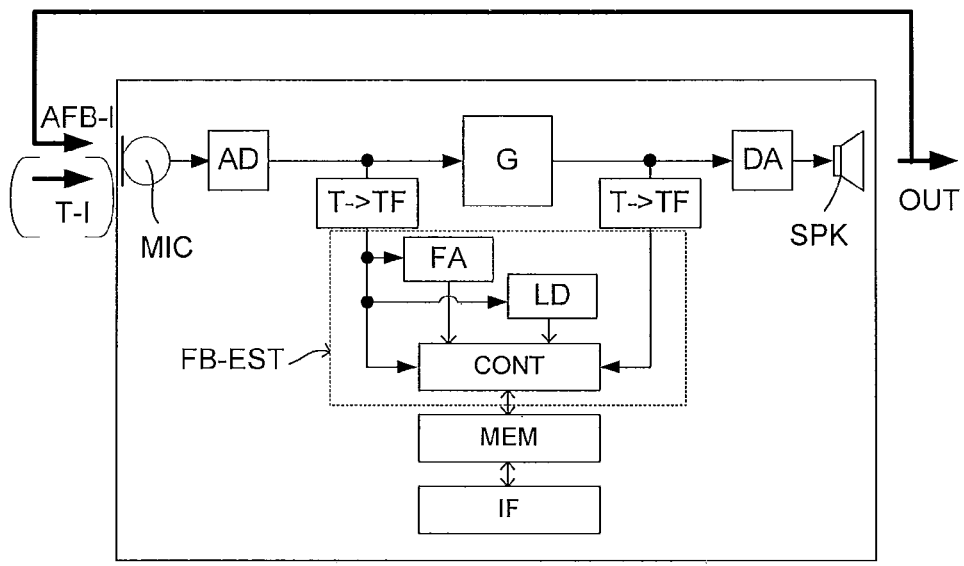
Figure 1D:
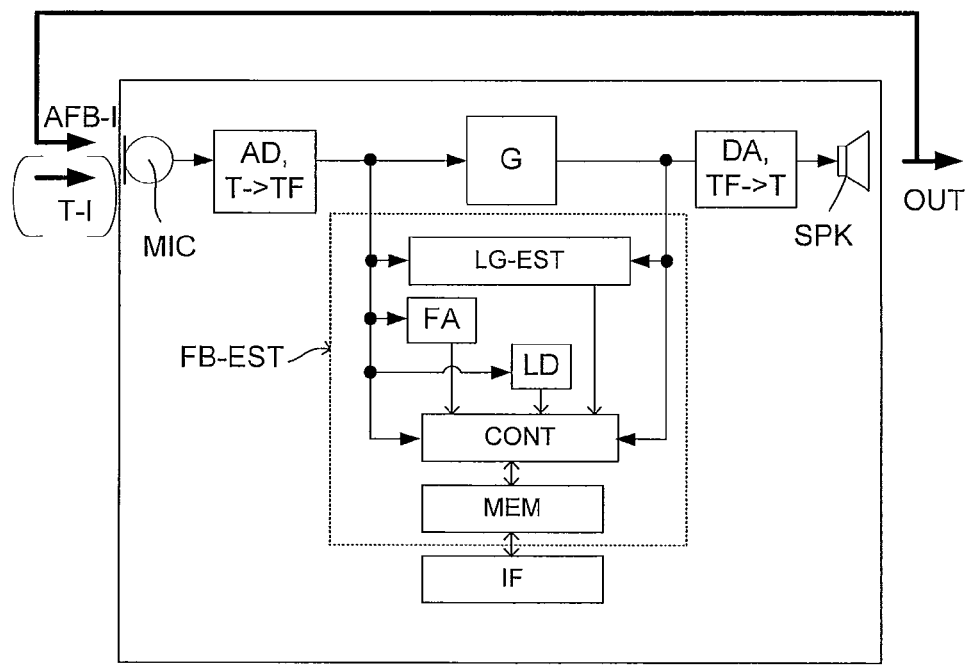

In the embodiments of a listening device of FIGS. 1b, 1c and 1d, the feedback estimation unit FB-EST comprises a level detector (LD) for determining the input level of the electric microphone signal. The input level of the electric microphone signal is in the present context indicative of the amount of feedback detected at a particular frequency. Level detection in hearing aids is e.g. described in WO 03/081947 A1 or U.S. Pat. No. 5,144,675. A level estimator in combination with the above-mentioned detection of tonal components or indications of frequency regions with high loop gain may be used to consolidate the collected feedback statistics.

In the embodiments of a listening device of FIGS. 1b, 1c and 1d, the feedback estimation unit FB-EST further comprises a frequency or spectrum analyzer (FA). The spectrum analyzer may be used to identify peaks in the spectrum. The frequency of the peak is the estimated feedback frequency. This method is, however, not very precise. Therefore, its result is typically post-processed. In an embodiment, subsequent estimates of feedback frequency are compared, and only accepted as feedback estimates if a predefined number of previous estimates were in the same frequency range (e.g. within an interval of +/−250 Hz). This is based on the experience that the feedback frequency is typically constant over a certain time interval. In addition to the post-processing, FA-based feedback identification can be combined with other feedback estimation methods for even further improving the quality of estimation. In one example, it is combined with the estimation of loop gain in the feedback path, e.g. by only accepting frequency estimates that are within the same frequency range as the peak of the loop gain estimate.

In the embodiments of a listening device of FIGS. 1b, 1c and 1d, the level detector (LD) and the frequency analyzer (FA) are both connected to a control unit (CONT) for providing a feedback estimate to be stored in the memory (MEM). The feedback estimate is based on one or more of the inputs to the control unit (CONT) including the electric input signal from the microphone (MIC), the electric output signal fed to the speaker (SPK), the level estimate of the electric input signal from the level detector (LD) and the power density spectrum from the frequency analyzing unit (FA). In the embodiment of FIG. 1d a loop gain estimator LG-EST is included in the feedback estimation unit FB-EST. The loop gain estimation unit may e.g. be based on an adaptive filter adapted to match the feedback path transfer function via e.g. an LMS algorithm, as described above. Estimation of loop gain in a hearing aid is e.g. described in WO9409604A1, in U.S. Pat. No. 6,665,410 in US2009067654A1 and in US2010232634A. One or more of the level detector (LD), frequency analyzer (FA) and feedback estimator (FB-EST) (or other detectors) may be included in the feedback estimation units FB-EST of the embodiments of FIG. 1b, 1c or 1d. In an embodiment, the feedback estimator FB-EST further comprises an adaptive filter (e.g. forming part of the control unit CONT). The adaptive filter (e.g. its adaptation rate) may e.g. be controlled based on one or more of the mentioned detectors.

The inputs of the different detectors (LD, FA, LG-EST, etc.) of the feedback estimator can be combined as indicated above. In an embodiment, the feedback estimate and the level detector (LD) output are compared. In an embodiment, the feedback estimate is only accepted as a valid estimate, if the LD output is higher than a certain predefined threshold value (e.g. 50 dB SPL).

In an embodiment, the control unit is implemented "without intelligence" so that average frequency and loop gain estimates are simply stored in the memory (MEM). In an embodiment, such values are only stored if the level detector output is above a certain predefined threshold level. In an embodiment, the consolidation or evaluation of the stored data is performed in the control unit. In an embodiment, the consolidation or evaluation of the stored data is performed in a post-processing procedure where the listening device is connected to a processing device (e.g. a device, such as a PC, running fitting software adapted for modifying and/or analyzing parameters or data of the listening device). A (wired or wireless) connection of the listening device to a processing device can be established via the interface IF of the listening device.

The embodiments of FIGS. 1c and 1d further comprise a time to time-frequency conversion unit (T→TF) for providing a time-frequency representation of an input signal in connection with the microphone unit (MIC) and the analogue to digital (AD) converter. The embodiment of FIG. 1c, where only the analysis path is processed in the frequency domain comprises a time to time-frequency conversion unit (T→TF) in each of the signal paths operationally connecting the analysis path to the input and output transducers respectively (here connected to the output of the AD converter and to the input of the DA converter, respectively). The embodiment of FIG. 1d, where the forward path as well as the analysis path are processed in the frequency domain, comprises a time to time-frequency conversion unit (T→TF) in the forward path connected to the electric input signal from the microphone (MIC) (here after the analogue to digital converter (AD)), and a time-frequency (TF→T) to time conversion unit for providing (synthesizing) an output signal in the time domain, which is fed to the output transducer (SPK), e.g. as here via a digital to analogue converter (DA). In an embodiment, the time-frequency representation comprises an array or map of corresponding complex or real values of the signal in question in a particular time and frequency range. In an embodiment, the TF conversion unit comprises a filter bank for filtering a (time varying) input signal and providing a number of (time varying) output signals each comprising a distinct frequency range of the input signal. In an embodiment, the TF conversion unit comprises a Fourier transformation unit for converting a time variant input signal to a (time variant) signal in the frequency domain. In an embodiment, the frequency range considered by the listening device from a minimum frequency $f_{min}$ to a maximum frequency $f_{max}$ comprises a part of the typical human audible frequency range from 20 Hz to 20 kHz, e.g. a part of the range from 20 Hz to 12 kHz. In an embodiment, the frequency range $f_{min}$-$f_{max}$ considered by the listening device is split into a number P of frequency bands, where P is e.g. larger than 2 or 5, such as larger than 10, such as larger than 50, such as larger than 100, at least some of which are processed individually. In an embodiment, the analysis and/or the forward paths of the listening device is/are adapted to process input signals in a number of different frequency ranges or bands. The frequency bands may be uniform or non-uniform in width (e.g. increasing in width with frequency).

In an embodiment, the listening device comprises an acoustic (and/or mechanical) feedback suppression system, e.g. an adaptive feedback cancellation system (not shown). Adaptive feedback cancellation has the ability to track feedback path changes over time. It is based on a linear time invariant filter to estimate the feedback path, where the filter weights are updated over time. The filter update may be calculated using stochastic gradient algorithms, including some form of the popular Least Mean Square (LMS) or the Normalized LMS (NLMS) algorithms. They both have the property to minimize the error signal in the mean square sense with the NLMS additionally normalizing the filter update with respect to the squared Euclidean norm of some reference signal. Various aspects of adaptive filters are e.g. described in [Haykin]. During measurement of acoustic feedback, such feedback suppression system may be active or in-active depending on the actual purpose of the verification procedure. In an embodiment, the feedback suppression system is in-active during verification. In an embodiment, the loop gain estimator is adapted to (re-)use the adaptive filter of the feedback suppression system (instead of having its own dedicated adaptive filter (incl. LMS algorithm) in the feedback estimator FB-EST). In this case the feedback suppression system should not be totally inactive during verification, but only paths that influence the output signal of the HI should be deactivated. In other words: in the case of re-using the adaptive filter of the feedback suppression system for loop gain estimation, e.g. the adaptive filter and the LMS processing should be active during verification.

In an embodiment, the listening device further comprises other relevant functionality for the application in question, e.g. compression, noise reduction, etc.

Acoustic filters or acoustic resonators with variable acoustic parameters are known from musical instruments (e.g. the flute or the trombone).

An example of the use of an acoustic filter which is a standard element in acoustics is e.g. given in [Blauert and Xiang, 2009], cf. in particular pages 113-116.

Figure 2:
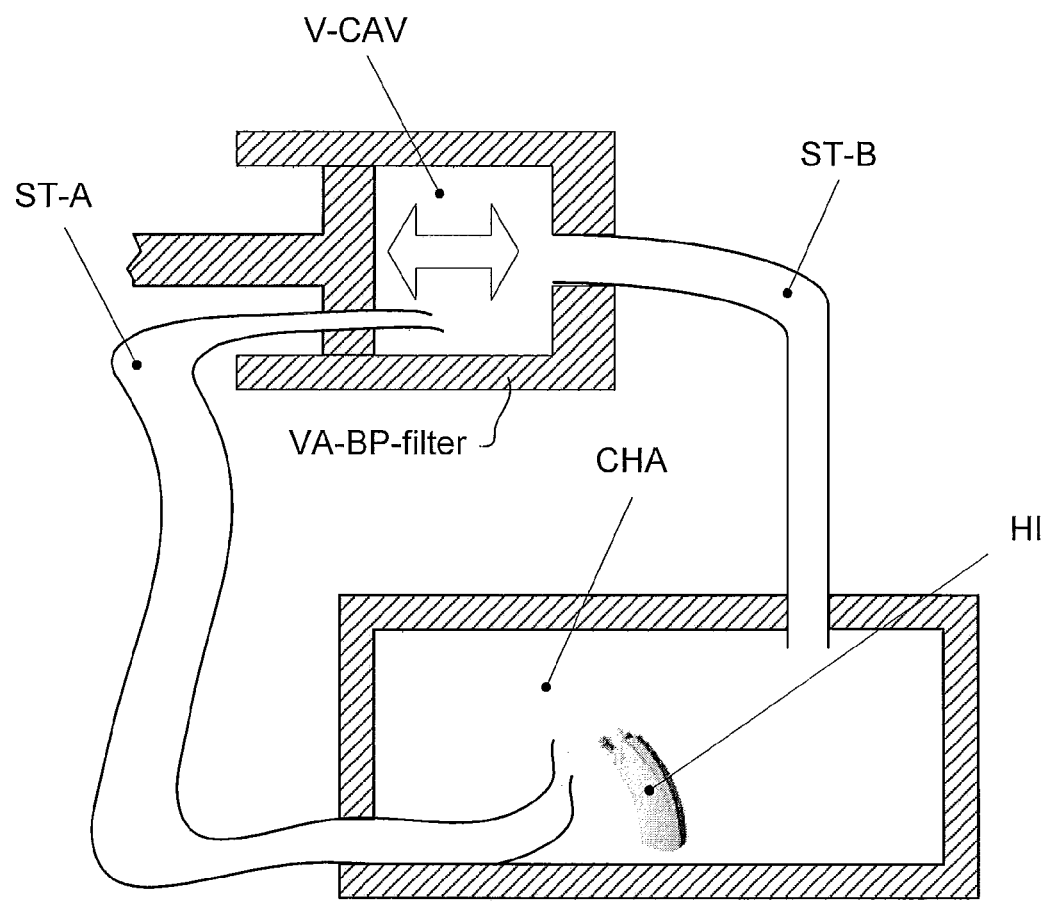
FIG. 2 shows a first embodiment of a test system according to the present disclosure.

An exemplary embodiment of the invention is shown in FIG. 2 in which a cavity of variable size implements an acoustic filter with variable impedance that should emulate the feedback path of a hearing instrument.

A hearing instrument is connected with this cavity via acoustic tubes in order to obtain an acoustic feedback loop: While sound extraction from the sound outlet of the hearing instrument is achieved by direct coupling with the sound tube, sound injection into the hearing instrument happens via a sound proof chamber.

Figure 3:
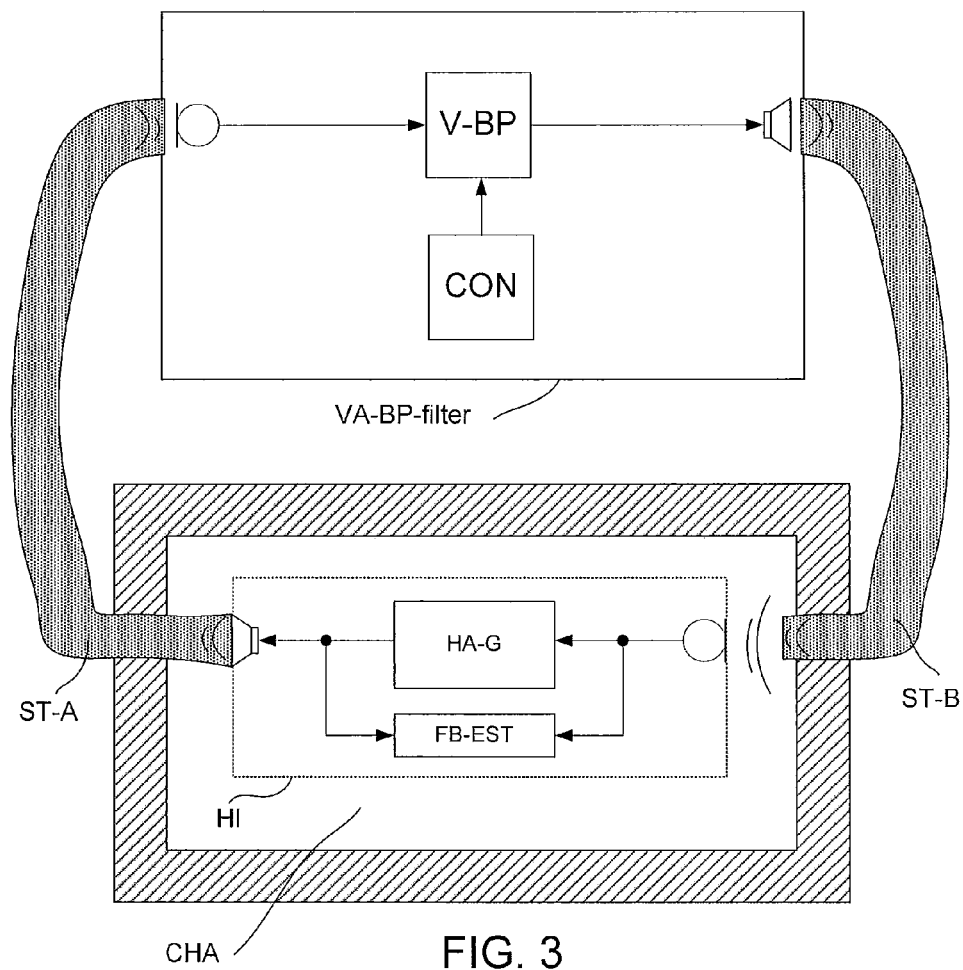
FIG. 3 shows a second embodiment of a test system according to the present disclosure.

When the listening device is mounted in the chamber, see FIGS. 2 and 3, settings for the listening device and a scheme for the variation of the transfer function of the filter are preferably determined in advance to allow a determination of feedback at different frequencies or frequency ranges. Such settings can e.g. be the maximum gain settings allowed for a given frequency. Alternatively, the settings can be settings suited for the compensation of a typical hearing loss or settings representing an extreme condition for the sake of testing. Such an extreme condition could be setting the listening device to a band pass characteristic in order to give it well-known resonance characteristics. In an example, the listening device is a hearing instrument and is set to a band pass characteristic by setting its gain controls except the ones for one certain frequency range to the minimum of their control range. In modern hearing instruments, such gain controls are typically implemented by functionalities of the so-called fitting software. In an embodiment, the test system is operated while the listening device is connected (via interface IF, cf. FIG. 1 or 4) to a processing device running specific fitting software for the listening device in question. In an embodiment, the test system is controlled via the fitting software.

FIG. 2 shows a first embodiment of a test system according to the present disclosure. In the first embodiment, the variable filter (VA-BP-filter) is a variable acoustic filter comprising a variable volume cavity V-CAV for changing a resonance frequency. The variable filter is adapted for implementing a bandpass filter with controllable centre frequency (and preferably a controllable bandwidth).

In an embodiment, the acoustic propagation elements (ST-A, ST-B) connecting the inputs and outputs of the respective chamber (CHA) and variable filter (VA-BP-filter) comprise (or each consist of) a tube. The length of the tube(s) connecting the variable filter and the chamber is(are) adapted to the application in question. Typically, the length of a tube depends on the highest feedback frequency $f_{max}$ that we want to obtain. A rule of thumb is to choose the tube length $L_{tube}$ much smaller than $c/f_{max}$, where c is a constant to be typically chosen as the speed of sound in air at the given ambient conditions (about 340 m/s in typical ambient conditions).

In an embodiment, the tube connecting the output of the chamber (CHA) and the input of the variable filter also extends from the receiver (speaker) output of the hearing instrument (HI) to the output of the chamber (e.g. as one piece led through the wall of the chamber, preferably through a soundproof connection, as indicated in FIG. 2).

In general, the acoustic input and output of the chamber (to which the acoustic propagation elements are connected) can be located at any points of the chamber walls, which are mechanically feasible, considering materials, form and dimensions of the chamber and connecting acoustic propagation elements (e.g. tubes). Preferably, the acoustic input of the chamber is located as close as possible to a microphone of the listening device.

The form and volume of the cavity (V-CAV) of the acoustic filter (VA-BP-filter) is preferably adapted to the frequency range over which it is intended to be variable. Preferably, the form of the cavity is cylindrical. In an embodiment, the volume of the cavity is variable between approximately 0 and 50 cm$^3$ (i.e. between 0 and $5 \cdot 10^{-5}$ m$^3$), e.g. between 1 cm$^3$ and 10 cm$^3$ (i.e. between $10^{-6}$ m$^3$ and $10^{-5}$ m$^3$).

The acoustic propagation elements (here tubes) can in general be connected to the cavity of the acoustic filter in FIG. 2 at any point, which is mechanically feasible, considering materials and dimensions. Preferably, however, the tubes are inserted into the cavity at opposite ends (as illustrated in FIG. 2). This has the advantage of easing a computer simulation of the acoustic behavior of the setup. In an embodiment, the tube from the output of the chamber to the input of the variable filter is continued through the plunger (or piston) and into the cavity of the variable filter, as shown in FIG. 2.

In an embodiment, one or more of the interior walls of the chamber (CHA) is/are provided with an acoustically attenuating material or layer. In an embodiment, the chamber is acoustically insulated. Preferably the chamber adapted to provide that sounds from the environment are not disturbing the feedback measurements.

Preferably, the test equipment is located in an acoustically insulated box, in a silent room, in a so and studio or the like. Thereby the requirements to acoustic insulation of the various parts of the test equipment are more relaxed.

The chamber (CHA) for enclosing the listening device is configured to allow external access to locate a listening device in the chamber. In an embodiment, the closed chamber wherein a listening device can be located comprises a lid or closure, which can be opened and closed (cf. element LID in FIG. 4). In an embodiment, the chamber is adapted to be closed in a sound-proof way during use of the system. In an embodiment, the chamber comprises a gasket for tightly closing the chamber when a listening device is operationally located in the chamber (cf. element GSK in FIG. 4).

FIG. 3 shows a second embodiment of a test system according to the present disclosure. In the second embodiment, the variable filter (VA-BP-filter) is a variable acoustic filter comprising an input transducer (a microphone) for converting an input sound received from speaker of the listening device under test (HI) via a first acoustic propagation element (ST-A) to an electric input signal, a variable electric filter (V-BP, CON) for passing a selected frequency band of the input signal (and attenuating other frequency ranges), and an output transducer (speaker) for converting the bandpass filtered signal to an output sound, propagated through a second acoustic propagation element (ST-B) to a microphone of the listening device under test (HI). In an embodiment, a (variable) delay may be introduced in the electric signal path, e.g. controlled by control unit CON. The embodiment of a test system shown in FIG. 3 comprises a chamber (CHA) enclosing the listening device (HI), e.g. a hearing instrument. The listening device comprises a forward path from a microphone to a speaker, wherein a signal processing unit (HA-G) provides a frequency dependent gain to the input signal from the microphone and provides a processed output signal to the speaker. The listening device further comprises a feedback estimation unit (FB-EST) for estimating and preferably storing data for characterizing feedback estimates at various points in time. The listening device (HI) may be of any appropriate kind, e.g. as indicated in the examples of FIG. 1.

In the embodiments of a test system shown in FIGS. 2 and 3, no specific analysing system is shown. In an embodiment, the pass band of the variable filter V-BP-filter is varied and the feedback is measured in the listening device. The data may be later analyzed using an analysis unit with an interface to the listening device, e.g. a processing unit adapted to run a fitting software of the listening device. Preferably, however, the test system comprises an analysing unit for controlling the feedback measurements and for analysing the measured data.

FIG. 4 shows a part of a third embodiment of a test system according to the present disclosure, wherein the chamber comprises a microphone and wherein an analysing unit is connected to the listening device. FIG. 4 shows a chamber (CHA) enclosing a listening device (HI) under test. The listening device (HI) comprises a forward path from a microphone to a speaker, wherein a signal processing unit (HA-G) provides a frequency dependent gain to the input signal from the microphone and provides a processed output signal to the speaker. The listening device further comprises a feedback estimation unit (FB-EST) for estimating and preferably storing data for characterizing feedback estimates at various points in time. The feedback estimation unit receives inputs from the input side and from the output side of the forward path (i.e. from each side of the signal processing unit (HA-G), before and after the application of a frequency dependent gain to the input signal). The listening device further comprises an interface (IF) to an analysing unit (ANA) allowing data exchange between the listening device and the analysing unit. The interface may be wired or wireless. The listening device may be of any appropriate kind, e.g. as indicated in the examples of FIG. 1. The control of the settings of the listening device during the acoustic feedback measurements may conveniently be performed by the analysing unit. In an embodiment, a maximum gain (for a particular user of the listening device in question) is used in the frequency band that is currently being tested for feedback. The chamber and listening device is acoustically connected to a variable filter (not shown) via acoustic propagation elements ST-A and ST-B. The speaker outlet from the listening device is tightly fitted to acoustic propagation element (ST-A) to minimize sound leakage into the chamber. The chamber comprises a lid (LID) and a gasket (GSK) between the lid and the rest of the chamber to which it fits, allowing access to the listening device, when the lid is off, and an acoustically tight connection to be established, when the lid is on. The dashed arrows indicate directions of propagation of sound signals to and from the variable filter. The test system further comprises a microphone (CM/C) external to the listening device allowing the system to pick up feedback sound in the chamber propagated from the variable filter through acoustic propagation element ST-B.

In an embodiment, the test system is adapted for experimenting with (developing) feedback and with feedback cancellation algorithms in the listening device, e.g. a Hearing Instrument (HI). In such case the test system is adapted to use the measurement microphone (CM/C) to measure the power spectrum of the feedback signal passed through the variable filter and to analyze it in the analyzing unit (ANA) by means of a spectrum analyzer or similar. Thereby the effect of parameter changes in a feedback estimation algorithm of the listening device can be immediately tested in practice. Preferably, the listening device is mounted in a realistic local environment as regards feedback, e.g. on an artificial head (cf. e.g. FIG. 8b). Preferably, the test system comprises one or more structural elements that can be inserted or activated relative to the listening device to simulate different feedback situations (cf. e.g. FIG. 8a), e.g. a hug or a telephone situation. Preferably, the test system comprises a variable delay unit to allow an appropriate delay to be inserted on the feedback path. Such delay unit may be based on an acoustic or electronic delay line component.

FIG. 5 shows a part of a fourth embodiment of a test system according to the present disclosure comprising an analysing unit connected to the listening device being tested. FIG. 5 illustrates a part of a test system comprising a wireless interface (IF) between an analysing unit (ANA) and the listening device under test and thus adapted to establish a wireless link (WIL) between the two devices. The listening device in FIG. 5 is shown to resemble the embodiment of a FIG. 1a, but may be implemented in any other way (e.g. as shown in FIG. 1b-1d) comprising a forward path between a microphone and a speaker, a feedback estimation unit and an interface to an analysing unit. In the embodiment of FIG. 5, the analysing unit ANA is implemented as a personal computer, comprising keyboard and display. The analysing unit may be implemented in any other appropriate form comprising a processing unit, a user interface and an interface to the listening device. The analysing unit is preferably adapted to run a fitting software of the listening device.

FIG. 6 shows an example of a variable acoustic filter. FIG. 6a shows a variable acoustic filter comprising a variable cavity enclosed between a cylindrical body, and two slideable transversal walls (both having circular cross sections matching the cross section of the cylindrical body). In the shown embodiment, the slideable transversal walls mounted on a threaded rod by means of nuts that allow changing their respective positions, in order to allow for modifying their distance from each other and thus adjust the volume of the cavity they form together with parts of the walls of the cylindrical body. The nuts allow for fixing the transversal walls to the threaded rod after changing their distance, such that it is possible to use the embodiment as described in the following, without accidentally changing the achieved distance. In an embodiment, one of the transversal walls has holes that allow sound to pass through the transversal wall. In an embodiment, one or both transversal walls comprise(s) one or multiple such holes covered by seals, allowing to open or close different sets of holes in order to modify properties of the acoustic path between the acoustic output and input of the listening device under test (and e.g. to insert one or more objects, e.g. a structural element, or e.g. a sensor, e.g. a microphone, in the cavity). In an embodiment, the different holes have different sizes. In an embodiment, the acoustic in- and out-lets from the cavity are adapted for being acoustically coupled from and to, respectively, the acoustic output and input of the listening device under test. In the embodiment shown in FIG. 6, the listening device (HI), here a so-called BTE-hearing instrument adapted for being mounted Behind The Ear of a user, is placed in the cavity of the variable filter (instead of in a separate chamber, as e.g. shown in FIGS. 2, 3 and 4). This has the advantage that one open end of the cylindrical body (the transversal wall comprising openings) can be made part of the acoustic path between the acoustic output and input of the listening device under test, such that the acoustic properties of the open end can assist shaping the desired acoustic filter properties. In the embodiment shown and as illustrated in FIG. 6b, the variable acoustic filter/chamber (CHA) comprises a measurement microphone (CM/C) for picking up sound in the cavity. The microphone is mounted through one of the transversal walls. The acoustic output of the BTE-hearing instrument (HI), a speaker feeding sound into the hook, is connected to an acoustic propagation element (plastic tube, ST-A) leading the sound to one of the transversal walls, where it leaves the cavity/chamber via a hole (acoustic output) and re-enters it through a (another) hole (acoustic input) in the transversal wall. Acoustic propagation from the acoustic input of the cavity/chamber to the microphone inlet of the hearing instrument (HI) is not guided by a specific guiding element (other than the walls of the cavity/chamber). FIG. 6b illustrates the cavity/chamber in an open configuration (e.g. for placing the hearing instrument (HI) in the cavity/chamber before performing measurements). FIGS. 6c and 6d illustrate the cavity/chamber (CHA) in a closed state (where the hearing instrument is located in the cavity/chamber during measurements). The cavity size can have different volumes between the setups shown in FIGS. 6c and 6d as indicated by different lengths $L_{C1}$ and $L_{C2}$ of the cylindrical volume expanded between the transversal walls. The different volumes correspond to different resonance frequencies of the cavity. The variable volume of the cavity is e.g. adapted to move a resonance frequency of the acoustic path—comprising the cavity, the propagation element(s), the holes in the transversal wall and the open end of the cylindrical body that is located closest to the transversal wall with the holes— between a lower and upper frequency spanning a frequency range [$f_{min,fb}$; $f_{max,fb}$], where feedback is expected, e.g. between 2 kHz and 5 kHz.

In an embodiment, a variable filter with a variable cavity as shown in FIG. 6 is used in combination with a listening device located outside the cavity e.g. in an acoustically insulated chamber (as e.g. illustrated in FIG. 2). In an embodiment, the variable filter is implemented by a syringe-like variable acoustic resonance cavity, where the acoustic inputs and outputs of the cavity are for example located in the piston- and needle-ends of the syringe, respectively.

Figure 7A:
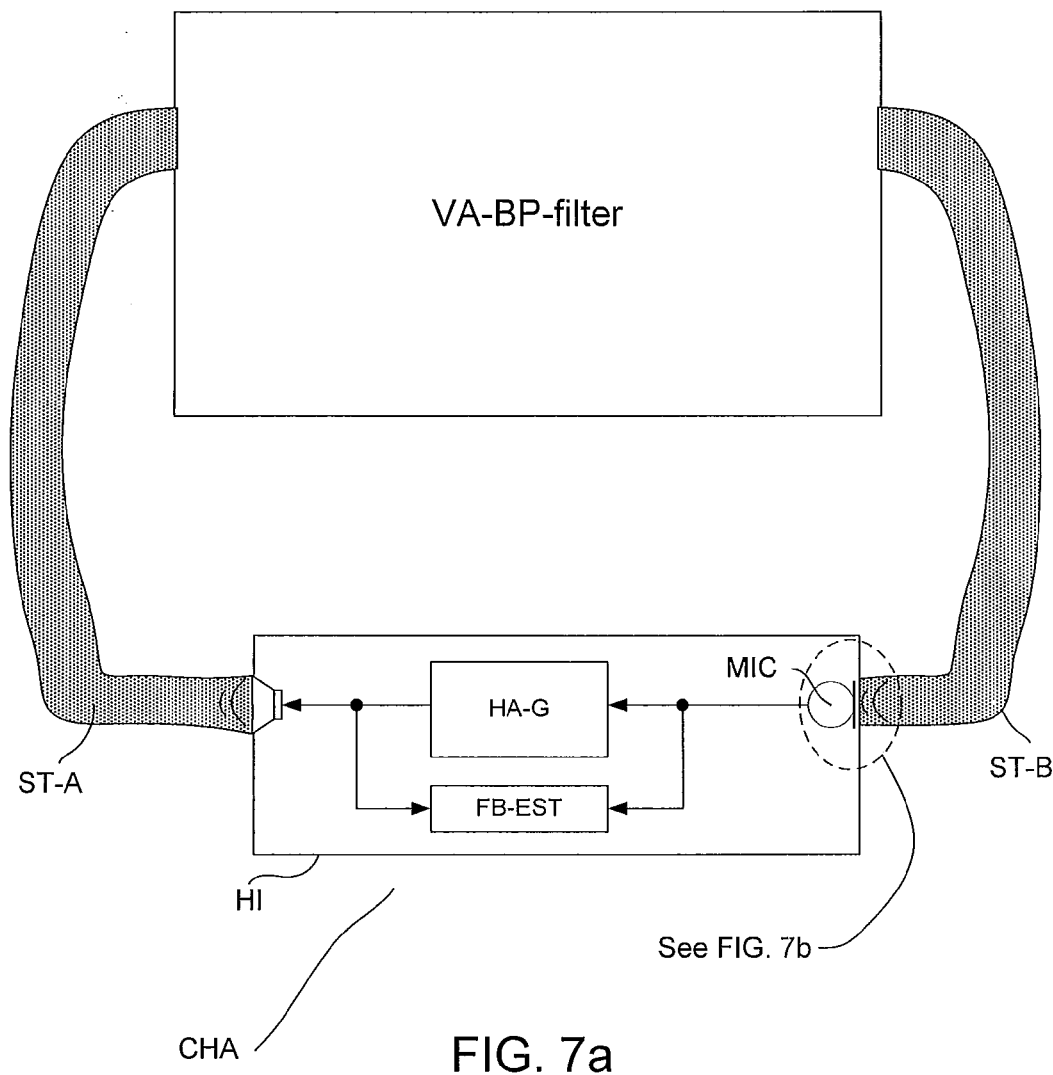
FIG. 7 shows a fifth embodiment of a test system according to the present disclosure, where the propagation elements to and from, respectively, the variable filter are connected directly to the acoustic input and output of the listening device being tested.
Figure 7B:
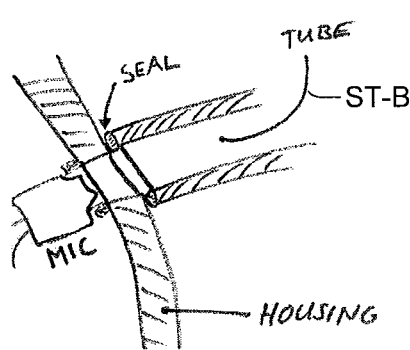

FIG. 7 shows a fifth embodiment of a test system according to the present disclosure, where the propagation elements to and from, respectively, the variable filter are connected directly to the acoustic input and output of the listening device being tested. FIG. 7a shows an embodiment of a test system without a chamber, the measurements being e.g. conducted in a silent environment, e.g. in a silent room, e.g. in an acoustically insulated room. The 'tubes' (ST-A, ST-B) to/from the variable filter (VA-BP-filter) are connected to the speaker output and microphone input, respectively, of the listening device (HI). FIG. 7b shows an example of the coupling of the connecting tube (ST-B) to the housing (HOUSING) of the listening device (HI). The acoustic propagation element (tube ST-B) is connected to the microphone (MIC) of the listening device via a microphone inlet in the housing. A sealing element (SEAL, e.g. a gasket) is located between the outer surface of the housing and the end of the tube, the inner opening (e.g. a diameter) of the tube preferably matching the opening of the microphone inlet. Alternatively, the sealing can be located in the housing wall, in which case the tube is entered through the housing wall, so that the sealing is performed between the outer surface of the tube and the microphone inlet. A similar (or different) sealing may be implemented at the speaker to tube (ST-A) interface.

FIG. 8 shows a part of a sixth and a seventh embodiment of a test system according to the present disclosure, where the test system comprises a structural element for emulating an operational condition of the listening device.

Figure 8A:
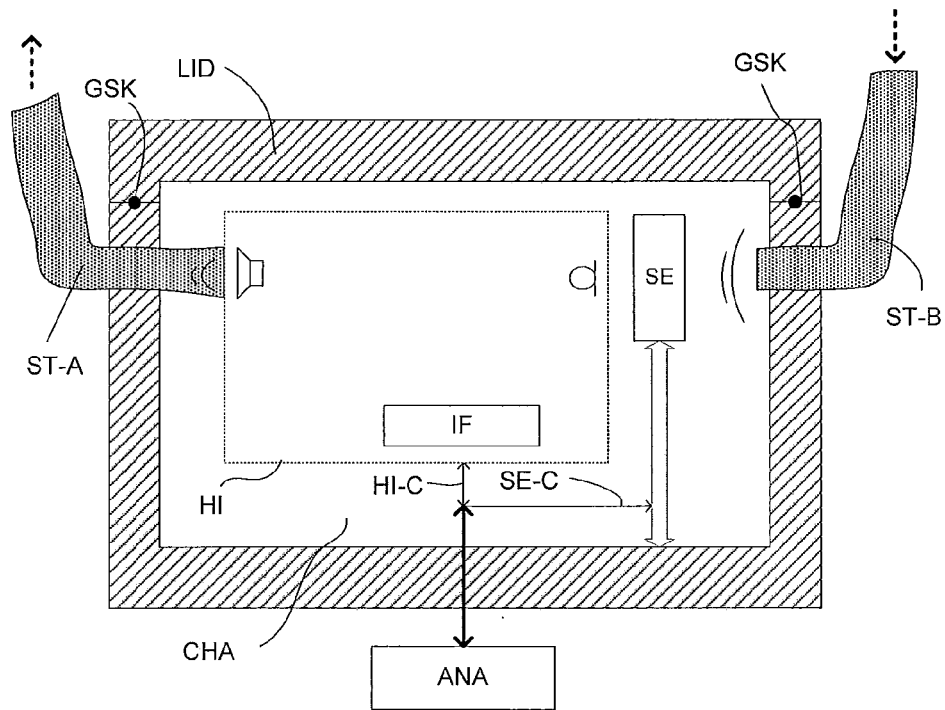
FIG. 8 shows a part of a sixth and a seventh embodiment of a test system according to the present disclosure, where the test system comprises a structural element for emulating an operational condition of the listening device.

FIG. 8a shows an embodiment of a test system comprising a chamber (CHA) wherein the listening device (HI) is located. The listening device can be of any appropriate kind (e.g. as shown in FIG. 1). Here the listening device is shown to comprise (at least) a speaker, a microphone and an interface (IF) to an analysing unit (ANA). The listening device can be controlled via signal HI-C. The chamber (CHA) is as shown in FIG. 4 and described in connection herewith. The chamber further comprises a controllable structural element (SE) for emulating a special feedback situation. The use of the structural element can be activated or deactivated from the analysing unit (ANA) via control signal SE-C (or alternatively, e.g. mechanically (e.g. manually) from the outside of the chamber, e.g. via an activating element extending through the wall of the chamber). The location of the structural element relative to the listening device (in particular to the microphone inlet of the listening device) is preferably also controllable from the analysing unit. Alternatively, the location may be manually controllable. The structural element may e.g. comprise an acoustically reflecting surface. By activating the structural element, the transfer function of the acoustic feedback path can be modified. In an embodiment, the effect of the use of the structural element in a given position on the feedback path is estimated (e.g. in advance of a feedback measurement). If the test system is used without the structural element, the static (or intrinsic) feedback path transfer function can be determined by the test system (where the listening device is not 'provoked' by nearby reflecting surfaces). By activating the structural element, the behaviour of the listening device in more demanding feedback situations can be monitored.

Figure 8B:
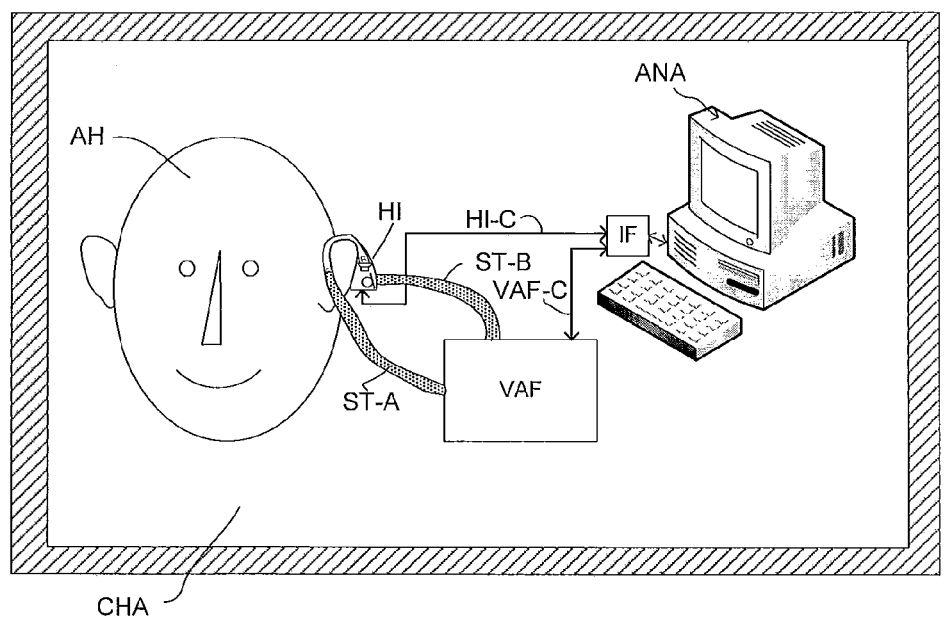

FIG. 8b shows an embodiment of a test system, wherein the system is enclosed in a chamber (CHA), preferably an acoustically insulated chamber. The listening device (LI) is mounted on an artificial head (AH) to emulate an operating condition of the listening device (e.g. a hearing instrument or a headset). The variable filter (VAF) is acoustically coupled to the acoustic output and input of listening device (HI) via acoustic propagation elements (ST-A) and (ST-8), respectively. The system comprises an analysing unit (ANA) with a communication interface (IF) to the listening device (HI) and to the variable filter (VAF). The variation of the transfer function of the variable filter can thereby be controlled from the analysing unit (ANA) via control signal VAF-C. Parameters of the listening device (e.g. gain) as well as determination of feedback for various transfer functions of the variable filter can thereby be controlled from the analysing unit (ANA) via control signal HI-C. Measured values of feedback can e.g. be read from the listening device and analysed in the analysing unit (if determined in the listening device). Alternatively, the analysing unit and the listening device may be coupled to allow a determination of feedback in the analysing unit.

EXAMPLE

An example of a feedback verification procedure is outlined in the following. In an embodiment, the listening device, e.g. in the form of a hearing instrument, comprises a "tone detector" configured to detect whether or not the signal contains feedback (optionally to detect a level of feedback) at a particular frequency. The results of feedback detection measurements performed at different frequencies (and possibly averaged over time) are logged in a memory of the listening device (or in a memory coupled to the listening device via an interface, cf. IF in FIG. 1). In an embodiment, the memory is implemented as data logger of the listening device. If the tone detector detects "feedback", then the data logger increases one counter in an indexed array of counters. The array index is e.g. chosen based on the estimated feedback frequency. At fitting time, where a PC running fitting software for customizing software of the hearing instrument is connected with the hearing instrument via a programming interface and appropriate cabling (or via a wireless connection). The fitting software then uses this programming interface to read out logged data from the memory, e.g. from the aforementioned array of counters from the hearing instrument. Each counter in the array maps to a certain range of feedback frequencies, such that a kind of density of counted feedback events over frequency can be computed from the distribution of individual counter values. The percentage belonging to a particular frequency or frequency range is 100 times the ratio between the value of the corresponding counter and the sum of all counter values in the array.

The logging or verification of feedback is exemplified by the following test procedure for a listening device in the form of a hearing instrument: The Hearing Instrument (HI) is adjusted to have a predefined gain profile, e.g. the maximum possible gain (typically frequency dependent according to a user's needs). Before start, the feedback logging memory is reset (e.g. in the sense that the memory, e.g. each counter in an array of counters, is initialized with zero at each frequency to be verified). The HI is inserted into the acoustically insulated chamber, as shown in FIG. 2 or 3, the chamber is subsequently closed, and the actual feedback logging procedure is started. The variable filter is adjusted to a frequency where it is desired to verify the ability of the listening device to detect the presence of feedback or the amount of feedback. Such adjustment can be manual or automatic according to a predefined frequency (scanning) scheme. In another exemplary test procedure, the variable filter is adjusted to the desired frequency prior to starting the feedback logging procedure. In an embodiment, the verification system (or the listening device, here HI) comprises a spectrum analyzer for recording the output signal of the HI by means of a measurement microphone that is located in the acoustically insulated chamber. The coupling of the variable filter to the listening device is a self-oscillating setup. An external spectrum analyzer may be used to check if the desired feedback frequencies can be induced with the variable filter prior to running the actual tests.

Once a feedback frequency within the specified tolerance of the test design occurs in steady-state, the HI in the described condition is left for monitoring for a predefined time, which is long enough to ensure that the detected feedback is that of a steady-state situation. In an embodiment, the monitoring time is longer than 10 s, such as longer than 100 s, such as longer than 1000 s.

Steady state measurements of feedback are conducted at the different predefined frequencies by changing the transfer function (e.g. the frequencies to pass) of the variable filter (according to a predefined scheme) and performing steady state measurements of feedback at each frequency or frequency range and store the individual results in the memory.

After having performed steady state measurements of feedback at the predefined frequencies, the HI is taken out of the acoustically insulated chamber, and e.g. connected to an analysis tool, e.g. a PC or other device containing an interface to the HI, e.g. a device running a specifically adapted fitting software (e.g. via a wired or wireless interface, cf. IF in FIG. 1), for evaluation of the feedback statistics. Alternatively, the hearing instrument may be connected to an analysis tool during the feedback measurements (which may be controlled from the analysis tool, cf. e.g. FIG. 4, 5, 8). Thereby the analysis may be continuously performed (updated as the measurements are conducted).

The invention is defined by the features of the independent claim(s). Preferred embodiments are defined in the dependent claims. Any reference numerals in the claims are intended to be non-limiting for their scope.

Some preferred embodiments have been shown in the foregoing, but it should be stressed that the invention is not limited to these, but may be embodied in other ways within the subject-matter defined in the following claims.

REFERENCES

[Haykin] S. Haykin, Adaptive filter theory (Fourth Edition), Prentice Hall, 2001.
[Blauert and Xiang, 2009], Blauert and Xiang, Acoustics for Engineers, Springer, Berlin, 2009.
WO 03/081947 A1
U.S. Pat. No. 5,144,675
WO9409604A1 (GN DANAVOX) 28 Apr. 1994
U.S. Pat. No. 6,665,410 (Parkins) 16 Dec. 2003
US2009067654A1 (WIDEX) 12 Mar. 2009
US2010232634A1 (OTICON) 16 Sep. 2010.

The invention claimed is:

1. A test system for evaluating acoustic feedback characteristics of a listening device by changing the transfer function of the signal path from an acoustic output to an acoustic input of the listening device, the test system comprising:
a variable filter comprising
an acoustic input,
an acoustic output,
a control unit for changing a transfer function of the filter,
an acoustic input transducer for converting an input sound to an electric input signal,
a variable electric filter for filtering the electric input signal and providing a filtered output signal, and
an acoustic output transducer for converting the filtered output signal to a filtered output sound;
a first acoustic propagation element and/or a second acoustic propagation element for propagating acoustic sound, the first acoustic propagation element acoustically connecting the acoustic output of the listening device with the acoustic input of the variable filter, the second acoustic propagation element acoustically connecting the acoustic output of the variable filter with the acoustic input of the listening device,
wherein the system is configured to allow a determination of acoustic feedback or a level of acoustic feedback of the listening device at different frequencies.

2. A test system according to claim 1 wherein the variable filter is designed to compensate for unintended filtering of the first and/or second acoustic propagation elements.

3. A test system according to claim 1 comprising a memory for storing estimates of current feedback values.

4. A test system according to claim 3 comprising an analyzing unit for accessing and analyzing the feedback data collected by the test system and stored in the memory.

5. A test system according to claim 4 wherein the analyzing unit comprises a feedback estimation unit for estimating current feedback in the listening device.

6. A test system according to claim 4 wherein the analyzing unit comprises a communication interface to the variable filter and/or to the listening device.

7. A test system according to claim 4 wherein the analyzing unit is adapted for running a fitting software of the listening device allowing the control of data and processing parameters of the listening device and the reading of data from the listening device.

8. A test system according to claim 1 comprising a structural element for emulating an operational condition of the listening device, when the listening device is mounted in the test system at or on said structural element.

9. A test system according to claim 1 comprising a chamber for enclosing one or more of the listening device, the variable filter and the propagation elements.

10. A test system according to claim 1 comprising a variable delay unit, allowing a time delay of the acoustic feedback path to be varied.

11. Use of a test system according to claim 1, wherein the listening device is a hearing instrument or a headset.

12. A test system according to claim 1, further comprising: the listening device to be tested.

13. The test system according to claim 12, wherein the listening device comprises a feedback estimation unit for estimating current feedback in the listening device.

14. The test system according to claim 13, wherein the listening device comprises a memory for storing estimates of current feedback values.

15. The test system according to claim 14, wherein the memory of the listening device form part of a data logger for logging various operational parameters, including the occurrence of acoustic feedback, of the listening device, over time.

16. A test system according to claim 1, further comprising: a test microphone for picking up a feedback signal from the second acoustic propagation element, the test microphone being located in the vicinity of the listening device when the listening device is mounted in the test system.

17. A test system for evaluating acoustic feedback characteristics of a listening device by changing the transfer function of the signal path from an acoustic output to an acoustic input of the listening device, the test system comprising:
- a variable filter, including
  - an acoustic input,
  - an acoustic output,
  - a control unit for changing a transfer function of the filter; and
- a first acoustic propagation element and/or a second acoustic propagation element for propagating acoustic sound, the first acoustic propagation element acoustically connecting the acoustic output of the listening device with the acoustic input of the variable filter, the second acoustic propagation element acoustically connecting the acoustic output of the variable filter with the acoustic input of the listening device; and
- a test microphone for picking up a feedback signal from the second acoustic propagation element, the test microphone being located in the vicinity of the listening device when the listening device is mounted in the test system, wherein
- the system is configured to allow a determination of acoustic feedback or a level of acoustic feedback of the listening device at different frequencies.

18. A test system for evaluating acoustic feedback characteristics of a listening device by changing the transfer function of the signal path from an acoustic output to an acoustic input of the listening device, the test system comprising:
- a variable filter, including
  - an acoustic input,
  - an acoustic output,
  - a control unit for changing a transfer function of the filter, and
  - an enclosure comprising a cavity with a variable volume allowing an acoustic resonance frequency of the system to be varied; and
- a first acoustic propagation element and/or a second acoustic propagation element for propagating acoustic sound, the first acoustic propagation element acoustically connecting the acoustic output of the listening device with the acoustic input of the variable filter, the second acoustic propagation element acoustically connecting the acoustic output of the variable filter with the acoustic input of the listening device, wherein
- the system is configured to allow a determination of acoustic feedback or a level of acoustic feedback of the listening device at different frequencies, and
- the system is adapted to provide that the listening device can be located in the cavity of the variable filter during test.

19. A test system according to claim 18, further comprising:
- a test microphone for picking up a feedback signal from the second acoustic propagation element, the test microphone being located in the vicinity of the listening device when the listening device is mounted in the test system.

20. A method of characterizing acoustic feedback at different frequencies from an acoustic output to an acoustic input of a listening device, the method comprising:
- providing a variable filter for selecting a part of a frequency range of operation of the listening device, the variable filter including
  - an acoustic input,
  - an acoustic output,
  - a control unit for changing a transfer function of the filter,
  - an acoustic input transducer for converting an input sound to an electric input signal,
  - a variable electric filter for filtering the electric input signal and providing a filtered output signal, and
  - an acoustic output transducer for converting the filtered output signal to a filtered output sound;
- acoustically connecting the acoustic output of the listening device to the acoustic input of the variable filter with a first acoustic propagation element;
- acoustically connecting the acoustic output of the variable filter to the acoustic input of the listening device with a second acoustic propagation element; and
- determining acoustic feedback or a level of acoustic feedback of the listening device in different parts of the frequency range.

* * * * *